United States Patent
Choi et al.

(10) Patent No.: US 9,650,710 B2
(45) Date of Patent: May 16, 2017

(54) SPUTTERING DEVICE AND SPUTTERING METHOD

(71) Applicant: Samsung Display Co., Ltd., Yongin, Gyeonggi-Do (KR)

(72) Inventors: Seung-Ho Choi, Yongin (KR); Yong-Suk Lee, Yongin (KR)

(73) Assignee: Samsung Display Co., Ltd. (KR)

(*) Notice: Subject to any disclaimer, the term of this patent is extended or adjusted under 35 U.S.C. 154(b) by 525 days.

(21) Appl. No.: 14/297,105

(22) Filed: Jun. 5, 2014

(65) Prior Publication Data
US 2015/0200383 A1    Jul. 16, 2015

(30) Foreign Application Priority Data
Jan. 10, 2014   (KR) .................. 10-2014-0003607

(51) Int. Cl.
| | | |
|---|---|---|
| C23C 14/35 | (2006.01) | |
| H01J 37/34 | (2006.01) | |
| C23C 14/54 | (2006.01) | |
| H01L 51/00 | (2006.01) | |
| C23C 14/00 | (2006.01) | |
| H01J 37/32 | (2006.01) | |

(52) U.S. Cl.
CPC ........ *C23C 14/545* (2013.01); *C23C 14/0042* (2013.01); *C23C 14/544* (2013.01); *H01J 37/32935* (2013.01); *H01J 37/3405* (2013.01); *H01J 37/347* (2013.01); *H01L 51/0008* (2013.01)

(58) Field of Classification Search
CPC .... C23C 14/35; C23C 14/56; H01J 37/32779; H01J 37/32899; H01J 37/3405; H01J 37/3417; H01J 37/3426; H01J 37/3452; H01J 37/3455
USPC ....................... 204/192.13, 298.03
See application file for complete search history.

(56) References Cited

U.S. PATENT DOCUMENTS

2013/0081942 A1    4/2013    Hinata et al.

FOREIGN PATENT DOCUMENTS

| JP | 06-145970 | 5/1994 |
|---|---|---|
| JP | 2006-265739 | 10/2006 |
| JP | 2010-056295 | 3/2010 |
| JP | 2010-065264 | 3/2010 |
| KR | 10-2013-0080000 | 7/2013 |

*Primary Examiner* — Rodney McDonald
(74) *Attorney, Agent, or Firm* — Innovation Counsel LLP

(57) ABSTRACT

One or more embodiments of the present invention relate to a sputtering device and a sputtering method. By using the sputtering device according to the present embodiment, characteristics of a deposition layer formed at the organic light emitting display apparatus may be improved, thereby improving electric characteristics and image quality of the organic light emitting display apparatus may be improved.

18 Claims, 7 Drawing Sheets

SPUTTERING DEVICE AND SPUTTERING METHOD

RELATED APPLICATIONS

This application claims the benefit of Korean Patent Application No. 10-2014-0003607, filed on Jan. 10, 2014, in the Korean Intellectual Property Office, the disclosure of which is incorporated herein in its entirety by reference.

BACKGROUND

1. Field

One or more embodiments of the present invention relate to a sputtering device and a sputtering method.

2. Description of the Related Art

Semiconductor devices, display devices, and any number of other electronic devices include a plurality of thin-films. Various methods are used to form such thin-films, including deposition methods.

Such deposition methods include sputtering, chemical vapor deposition (CVD), atomic layer deposition (ALD), etc.

Among display devices, organic light emitting devices features a wide viewing angle, excellent contrast, and a fast response, and are thus being spotlighted as next-generation display devices.

An organic light emitting device includes a first electrode and a second electrode facing each other, an intermediate layer, which includes an emission layer and is arranged between the first and second electrodes, and one or more thin-films. In such a case, sputtering may be used to form thin-films of an organic light emitting device.

The sputtering method may be performed in various manners. For example, a thin-film may be formed on a substrate by moving the substrate while a target unit is stopped or by revolving a cylindrical target unit.

SUMMARY

A sputtering device and a sputtering method are provided.

Additional aspects will be set forth in part in the description which follows and, in part, will be apparent from the description, or may be learned by practice of the presented embodiments.

According to one aspect, a sputtering device includes a chamber; a supporting unit, which is arranged inside the chamber and supports a substrate; a target unit, which is arranged inside the chamber to face the supporting unit; a driving unit, which is connected to either the supporting unit or the target unit and linearly moves either the supporting unit or the target unit to which it is connected; a power supply unit, which applies a voltage between the target unit and the supporting unit, between the target unit and the chamber, or between the target unit and the substrate; a sensor unit, which measures at least one of a flow rate of oxygen and a flow rate of nitrogen inside the chamber; a thickness measuring unit, which measures a thickness of a material deposited on the substrate; and a control unit, which controls the driving unit to be driven according to preset values to deposit the material on the substrate to a preset first target thickness, controls the power supply unit to form a preset voltage to deposits the material on the substrate, calculates a deposition rate of the deposited material from either a moving speed of the substrate or a moving speed of the target unit and a deposition thickness of the deposited material measured by the thickness measuring unit, and calculates and stores a relationship between the at least one of the flow rate of oxygen and the flow rate of nitrogen measured by the sensor unit during a deposition of the deposited material and the deposition rate.

The deposition rate of the deposited material may be calculated by multiplying either the moving speed of the substrate or the moving speed of the target unit by the thickness of the deposited material.

The control unit may store the deposition rate of the deposited material according to either the flow rate of oxygen or the flow rate of nitrogen.

The relationship between either the flow rate of oxygen or the flow rate of nitrogen and the deposition rate of the deposited material may be a linear relationship.

The control unit may calculate the deposition rate corresponding to either the flow rate of oxygen or the flow rate of nitrogen inside the chamber that is measured by the sensor unit after deposition is completed with respect to at least one substrate.

The control unit may calculate the moving speed of the substrate or the moving speed of the target unit according to a preset second target thickness from the calculated deposition rate.

The control unit may deposit the material on the substrate while controlling the driving unit to move the substrate or the target unit at the calculated moving speed.

According to another aspect, a sputtering method includes introducing a substrate into a chamber, the substrate supported by a supporting unit and facing a target unit, supplying oxygen or nitrogen into the chamber, applying a voltage to one from among between the supporting unit and the target unit, between the chamber and the target unit, and the substrate and the target unit, and performing a deposition to a preset first target thickness; measuring and storing either a flow rate of the oxygen or a flow rate of the nitrogen while the deposition is being performed and storing either a moving speed of the supporting unit or a moving speed of the target unit; and calculating a deposition rate of the material based on either the moving speed of the supporting unit or the moving speed of the target unit and a thickness of the material deposited on the substrate.

The deposition rate of the deposited material may be calculated by multiplying either the moving speed of the substrate or the moving speed of the target unit by the thickness of the deposited material.

The sputtering method may further include calculating and storing a relationship between either the flow rate of oxygen or the flow rate of nitrogen and the deposition rate of the deposited material.

The relationship between either the flow rate of oxygen or the flow rate of nitrogen and the deposition rate of the deposited material may be a linear relationship.

Either the flow rate of oxygen or the flow rate of nitrogen and the deposition of the material corresponding thereto may be stored in the form of a table.

The sputtering method may further include, when the above-stated operations are completed and a substrate is introduced into the chamber, measuring flow rate of oxygen or flow rate of nitrogen inside the chamber.

The sputtering method may further include determining the deposition rate corresponding to the measured flow rate of oxygen or flow rate of nitrogen.

The sputtering method may further include calculating either the moving speed of the substrate or the moving speed of the target unit based on a preset second target thickness and the deposition rate and depositing the material on the substrate while moving the substrate or the target unit.

The sputtering method may further include repeating the introducing, supplying, applying, measuring and storing, storing, and calculating processes for a plurality of substrates.

The sputtering method further includes determining whether there is data related to the deposition rate corresponding to the flow rate of oxygen or the flow rate of nitrogen.

The sputtering method further includes, if there is no data related to the deposition rate corresponding to the flow rate of oxygen or the flow rate of nitrogen, securing data related to the deposition rate corresponding to the flow rate of oxygen or the flow rate of nitrogen by repeating the introducing, supplying, applying, easruing and storing, storing, and calculating processes.

These general and specific embodiments may be implemented by using a system, a method, a computer program, or a combination thereof.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
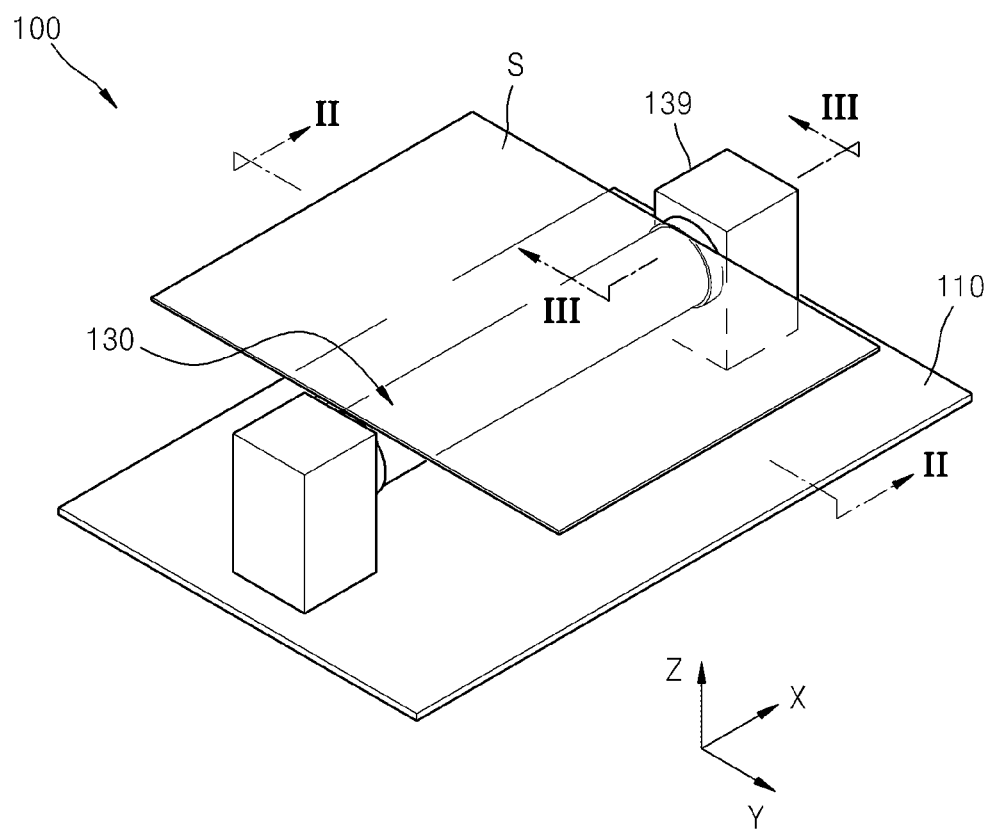
FIG. 1 is a diagram showing a sputtering device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
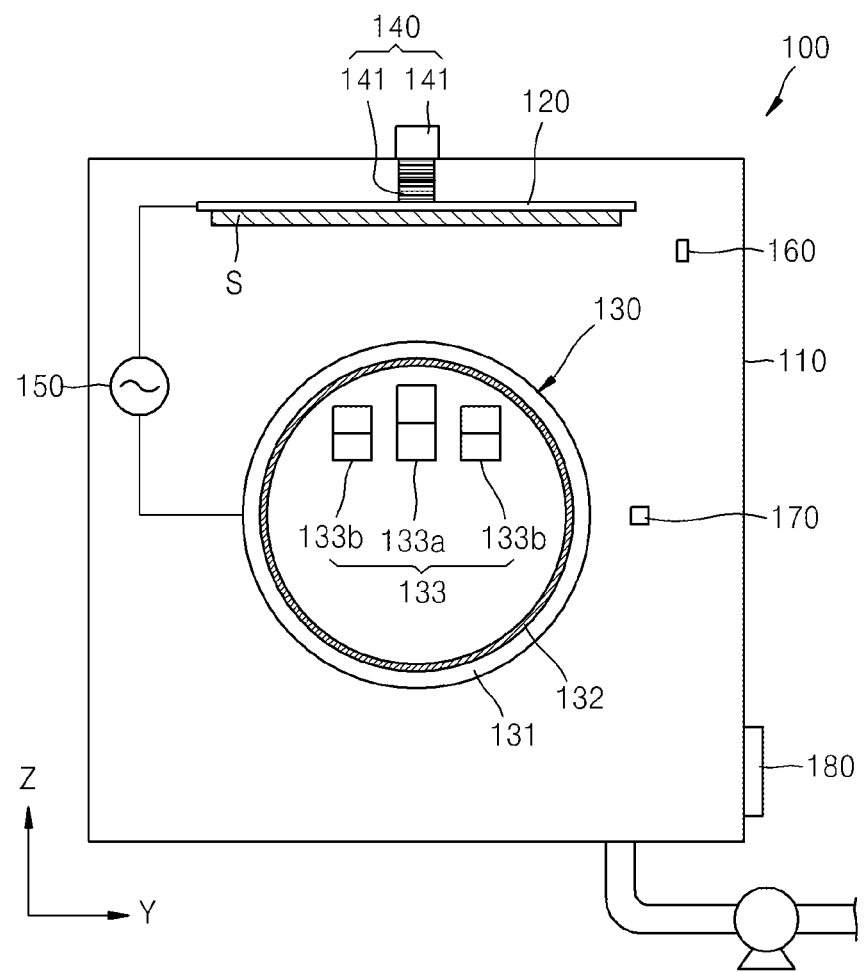
FIG. 2 is a sectional view, taken along a line II-II of FIG. 1.
Figure 3:
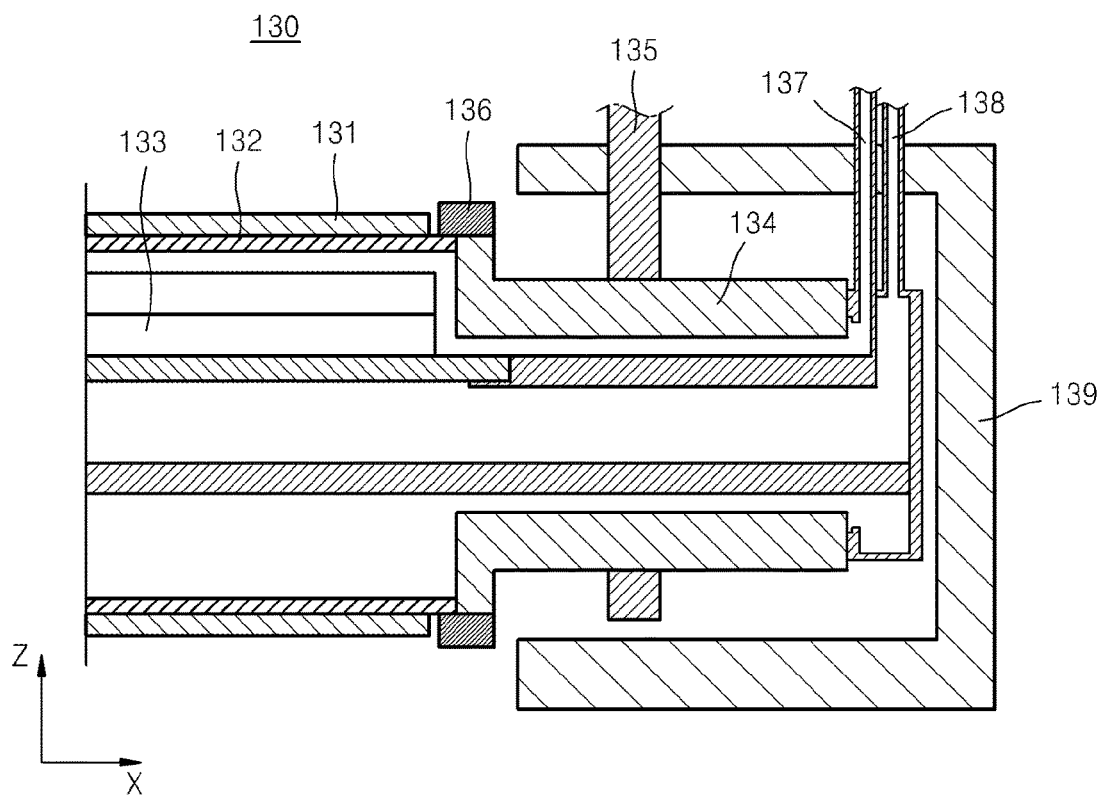
FIG. 3 is a sectional view, taken along a line III-Ill of FIG. 1.

FIG. 1 is a diagram showing a sputtering device 100 according to an embodiment. FIG. 2 is a sectional view, taken along a line II-II of FIG. 1. FIG. 3 is a sectional view, taken along a line III-Ill of FIG. 1.

Referring to FIGS. 1 through 3, the sputtering device 100 may include a chamber 110 in which a space is formed. Here, various gases may be introduced into the chamber 110. For example, argon (Ar) may be introduced into the chamber 110 from the exterior of the chamber and may form plasma during deposition, and oxygen ($O_2$) or nitrogen ($N_2$) may be supplied from the exterior of the chamber and may determine properties of a layer deposited on a substrate S.

The sputtering device 100 may include a supporting unit 120, which is arranged inside the chamber 110 and supports the substrate S. Here, the supporting unit 120 may support the substrate S to face downward or upward in the chamber 110. For convenience of explanation, descriptions will be given below regarding a case where the supporting unit 120 supports the substrate S to face downward in the chamber 110.

The supporting unit 120 prevents movement or oscillation of the substrate S while a deposition is being performed to the substrate S. The supporting unit 120 may include a clamp (not shown). Furthermore, for absorption between the supporting unit 120 and the substrate S, the supporting unit 120 may include one or more absorption holes. Furthermore, the supporting unit 120 may be formed of a material with high thermal resistance and high durability to prevent deformations and damages due to heat during a deposition.

The sputtering device 100 may include a target unit 130, which is arranged inside the chamber 110 so as to face the supporting unit 120. For example, if the supporting unit 120 is arranged in the upper portion of the chamber 110, the target unit 130 may be arranged in the lower portion of the chamber 110, or vice versa. For convenience of explanation, descriptions will be given below regarding a case where the target unit 130 is arranged in the lower portion of the chamber 110.

The target unit 130 may be formed in any of various shapes. For example, the target unit 130 may be formed to have a plate-like shape. According to another embodiment, the target unit 130 may be formed to have a cylindrical shape. According to another embodiment, the target unit 130 may be formed to have a polygonal column-like shape.

The target unit 130 may or may not include a magnet member. Here, if the target unit 130 includes the magnet member, the magnet member may form a magnetic field and control path and distribution of plasma, thereby controlling deposition efficiency. For convenience of explanation, descriptions will be given below regarding a case where the target unit 130 is formed to have a cylindrical shape and the target unit 130 includes the magnet member.

The target unit 130 may be rotatably installed. For example, the target unit 130 may include a cylindrical target 131 and a backing plate 132 supporting the cylindrical target 131. Here, the backing plate 132 has a shape similar to that the cylindrical target 131, which has a hollow cylinder-like shape, where the backing plate 132 may be arranged inside the cylindrical target 131 and support the cylindrical target 131. Furthermore, the backing plate 132 may maintain the temperature of the cylindrical target 131 at a constant temperature during a deposition, and power may be applied to the backing plate 132 by a power supply unit 150 described below. For example, an alternating current (AC) power or a direct current (DC) power may be applied to the backing plate 132, and the backing plate 132 may function as a cathode. Therefore, the cylindrical target 131 connected to the backing plate 132 may function as a cathode. Of course, the cylindrical target 131 may be employed without the backing plate 132. In this case, power may be applied to the cylindrical target 131.

The target unit 130 may include a magnet member 133 arranged inside the cylindrical target 131. The magnet member 133 may have a shape extending in the lengthwise direction of the cylindrical target 131. The magnet member 133 may not rotate while the cylindrical target 131 is rotating during a deposition. In other words, the magnet member 133 may not be connected to the cylindrical target 131 and the backing plate 132.

The magnet member 133 may form a magnetic field for controlling plasma discharge. For example, the magnet member 133 may include a first magnet member 133*a* and second magnet members 133*b* arranged at two opposite sides of the first magnet member 133*a*. Here, the first magnet member 133*a* and the pair of second magnet members 133*b* are arranged to have opposite polarities. As a result, a magnetic field formed by the magnet member 133 may be concentrated at a portion of the cylindrical target 131, and thus plasma discharge may be controlled to be concentrated at a portion of the cylindrical target 131.

The backing plate 132 and the cylindrical target 131 may be rotated by a driving shaft 134. In detail, the driving shaft 134 may be connected to a target driving unit 135, such as a driving belt, and receive driving power, thereby revolving the backing plate 132 and the cylindrical target 131. Here, the power supply unit 150 described below is connected to the driving shaft 134, and power may be applied to the backing plate 132 via the driving shaft 134.

The driving shaft 134 is formed to extend from two opposite ends of the backing plate 132 and may be accommodated by a housing 139. Furthermore, the backing plate 132 and the driving shaft 134 may be connected and fixed to each other via a backing tube 136. However, the present disclosure is not limited thereto, and the backing plate 132 and the driving shaft 134 may be integrated as a single unit without the backing tube 136.

A cooling fuild introducing pipe 137 and a cooling fuild draining pipe 138 are formed at the housing 139, and the cooling fuild introducing pipe 137 and the cooling fuild draining pipe 138 may be connected to the interior of the cylindrical target unit 130 and circulate a cooling fuild. Therefore, heat generated by the cylindrical target 131 during a deposition is absorbed to the cooling fluid via the backing plate 132, thereby maintaining the cylindrical target 131 at a constant temperature. As a result, efficiency of a sputtering operation may be improved.

The sputtering device 100 may include a driving unit 140, which is connected to either the supporting unit 120 or the target unit 130 and linearly moves either the supporting unit 120 or the target unit 130. Here, the driving unit 140 may linearly move either the supporting unit 120 or the target unit 130 to penetrate through the chamber 110. Furthermore, the driving unit 140 may reciprocate either the supporting unit 120 or the target unit 130 inside the chamber 110. For convenience of explanation, descriptions will be given below regarding a case where the driving unit 140 linearly moves the supporting unit 120.

The driving unit 140 may have any of various configurations. For example, the driving unit 140 may include a motor 141 and a rack gear 142, which is connected to the motor 141 and linearly moves as the motor 141 is driven. According to another embodiment, the driving unit 140 may be a linear motion system utilizing the magnetic levitation mechanism. However, the driving unit 140 is not limited thereto, and may include any device and any structure that is arranged between either the supporting unit 120 or the target unit 130 and the chamber 110 and linearly moves either the supporting unit 120 or the target unit 130 with respect to the chamber 110. However, for convenience of explanation, descriptions will be given below regarding a case where the driving unit 140 includes the motor 141 and the rack gear 142.

The sputtering device 100 may include the power supply unit 150, which applies power between the target unit 130 and the supporting unit 120, between the target unit 130 and the chamber 110, or between the target unit 130 and the substrate S. Here, the power supply unit 150 may be a low frequency (LF), a middle frequency (MF), or a radio frequency (RF) AC power supply or a DC power supply. However, for convenience of explanation, descriptions will be given below regarding a case where the power supply unit 150 applies a voltage between the target unit 130 and the supporting unit 120 and is a RF AC power supply.

The sputtering device 100 may include a sensor unit 160, which measures a flow rate of oxygen or a flow rate of nitrogen inside the chamber 110. Here, the sensor unit 160 may measure the flow rate of oxygen or the flow rate of nitrogen based on resistance changes due to contact to oxygen or nitrogen or by emitting a light from the sensor and analyzing the wavelength of the light. The sensor unit 160 may include any sensor generally used for measuring the flow rate of a gas. For convenience of explanation, descriptions will be given below regarding a case where oxygen is used inside the chamber 110 and the sensor unit 160 measures the flow rate of oxygen.

The sputtering device 100 may include a thickness measuring unit 170, which is arranged inside the chamber 110 and measures thickness of a material deposited on the substrate S. Here, the thickness measuring unit 170 may measures thickness of a material deposited on a surface of the substrate S by emitting a light or a laser beam onto the surface of the substrate S and analyzing a reflection index. Particularly, the thickness measuring unit 170 may include an Ellipsometer.

The sputtering device 100 may include a control unit 180, which controls the driving unit 140 and the power supply unit 150. Here, the control unit 180 may be formed in any of various forms. For example, the control unit 180 may be a circuit board installed at the chamber 110. Furthermore, the control unit 180 may be a circuit board arranged outside of the chamber 110, a personal computer, or a portable terminal. However, the present disclosure is not limited thereto, and the control unit 180 may include any devices and any structures capable of receiving signals, processing the signals, and controlling other devices.

The control unit 180 may perform various operations. For example, the control unit 180 may receive and store the flow rate of oxygen measured by the sensor unit 160. Furthermore, the control unit 180 may receive and store the thickness of a material deposited on the substrate S that is measured by the thickness measuring unit 170 during a deposition.

The control unit 180 may drive the driving unit 140 based on preset values, such that a material deposited on the substrate S is deposited to a preset first target thickness. Here, the control unit 180 may control the power supply unit 150 to apply a preset voltage to form a preset voltage.

Other than the above-stated cases, the control unit 180 may continuously receive and store the flow rate of the oxygen measured by the sensor unit 160 during a deposition. Furthermore, the control unit 180 may calculate a deposition rate at which the material is deposited on the substrate S based on a moving speed of the substrate S due to operation of the driving unit 140 and thickness of the material deposited on the substrate S that is measured by the thickness measuring unit 170.

When a deposition rate is calculated as described above, the control unit 180 may calculate a relationship between the deposition rate and the flow rate of oxygen and store the deposition rate according to the flux of oxygen. Here, the deposition rate according to the flux of oxygen may be stored in the form of an equation regarding the flux of oxygen, and the deposition rates according to the fluxes of oxygen may be stored in the form of a table.

Figure 4:
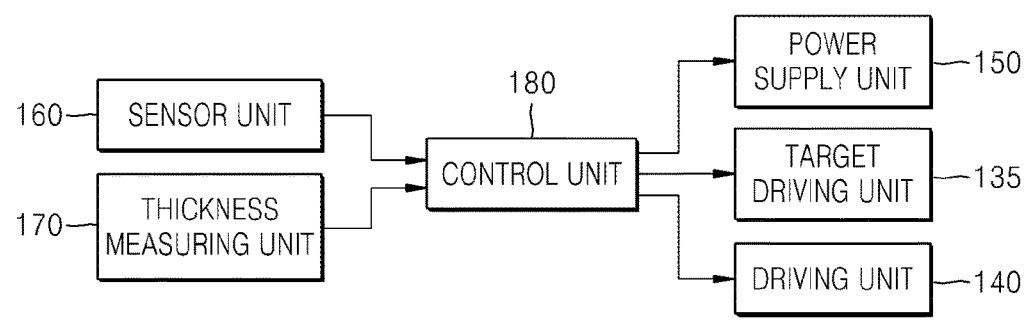
FIG. 4 is a block diagram showing a flow of controlling the sputtering device shown in FIG. 1.
Figure 5:
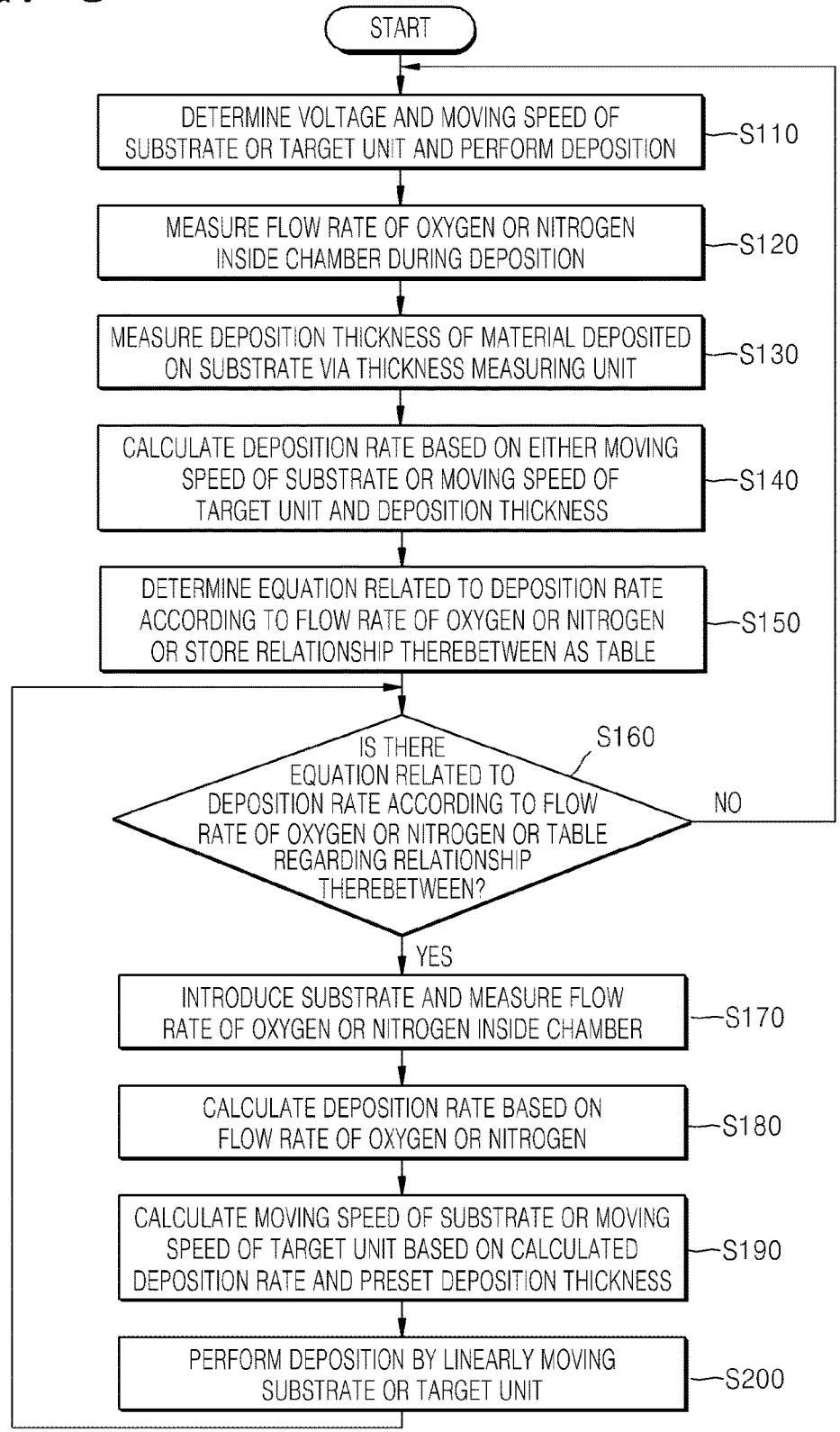
FIG. 5 is a flowchart showing a sequence of controlling the sputtering device shown in FIG. 1.
Figure 6:
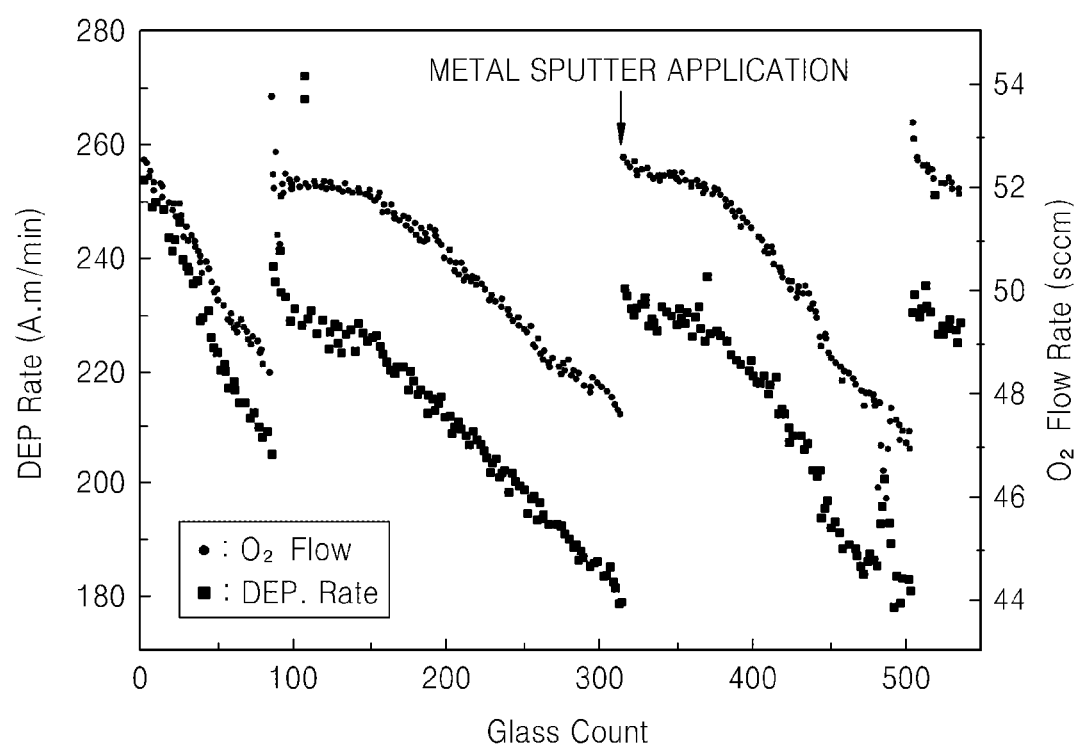
FIG. 6 is a graph showing deposition rates according to the number of substrates in the sputtering device shown in FIG. 1.
Figure 7:
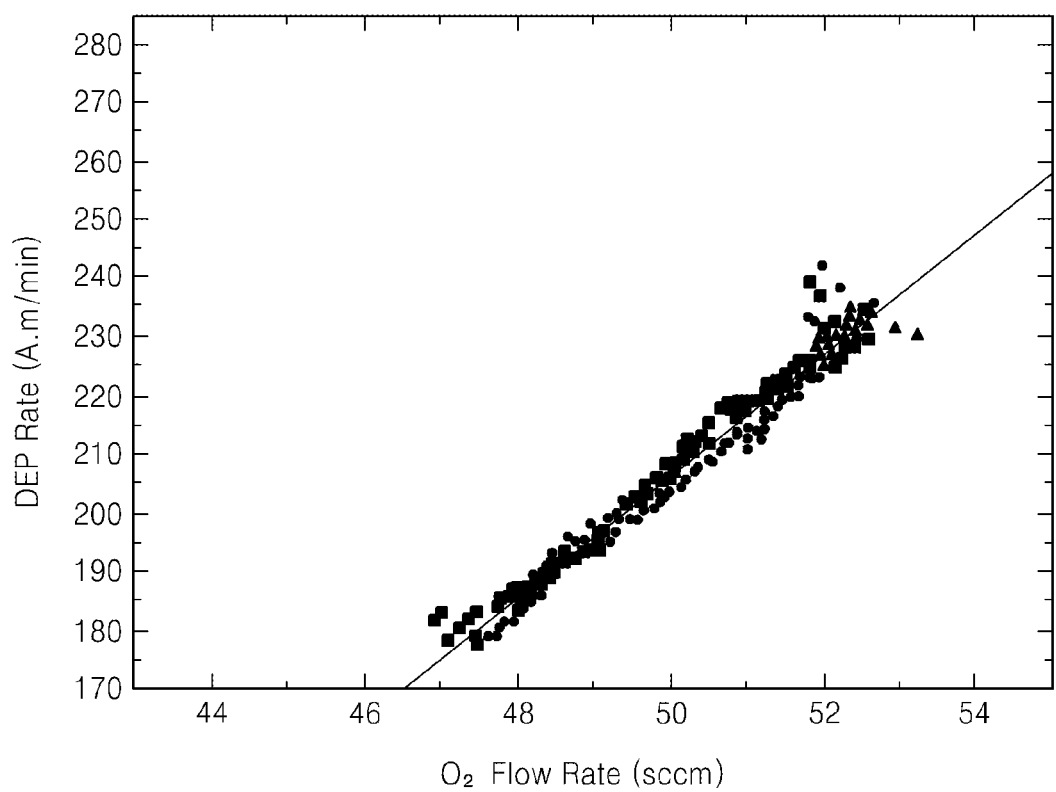
FIG. 7 is a graph showing deposition rates according to fluxes of oxygen of the sputtering device shown in FIG. 1.

FIG. 4 is a block diagram showing a flow for controlling the sputtering device 100 shown in FIG. 1. FIG. 5 is a flowchart showing a sequence for controlling the sputtering device 100 shown in FIG. 1. FIG. 6 is a graph showing deposition rates according to the number of substrates in the sputtering device 100 shown in FIG. 1. FIG. 7 is a graph showing deposition rates according to fluxes of oxygen of the sputtering device 100 shown in FIG. 1.

Referring to FIGS. 4 through 7, the sputtering device 100 may first perform an initial deposition for calculating a relationship between flux of oxygen used for a sputtering operation and a deposition rate. Here, the initial deposition may be performed based on preset values, and the control unit 180 may obtain and store various information.

In detail, when the initial deposition is performed, the substrate S is introduced inside the chamber 110 of the sputtering device 100, and the cylindrical target 131 for providing a material for forming a deposition layer on the substrate S may be arranged to face the substrate S. Next, a voltage may be applied between the cylindrical target 131 and the supporting unit 120, and plasma state is induced by using a gas injected into the chamber 110, where excited particles which collide with the cylindrical target 131 and separate from the cylindrical target 131 may reach a surface of the substrate S and form a deposition layer. Here, the deposition layer may vary according to a material constituting the cylindrical target 131 and a gas injected into the chamber 110.

Because the cylindrical target 131 rotates while deposition is being performed as described above, deposition may be performed while the entire surface of the cylindrical target 131 is being uniformly used.

While the deposition is being performed, the driving unit 140 may operate and linearly move the substrate S. Here, the substrate S may be linearly moved in a direction perpendicular to the lengthwise direction of the cylindrical target 131. The moving speed of the substrate S based on operation of the driving unit 140 may be set in advance.

In detail, when a first target thickness is set to the control unit 180, a moving speed of the substrate S corresponding to the first target thickness may be determined. Here, the moving speeds of the substrate S corresponding to the first target thicknesses may be stored in the form of a table. Therefore, when the first target thickness is changed, the moving speed of the substrate S may be determined in correspondence thereto.

Furthermore, other than the above-stated case, a voltage applied by the power supply unit 150 may also be preset to the control unit 180. For example, a voltage applied by the power supply unit 150 may be preset to the control unit 180 in correspondence to the first target thickness. Here, when the first target thickness is changed, a voltage applied by the power supply unit 150 may vary in correspondence thereto. Furthermore, a voltage applied by the power supply unit 150 may be changed based on a setting of the control unit 180 or an external setting.

When deposition is performed, after the moving speed of the substrate S and the voltage applied by the power supply unit 150 are set, the flow rate of oxygen injected into the chamber 110 may vary according to the voltage applied by the power supply unit 150.

In detail, the flow rate of oxygen may be controlled by the control unit 180 according to a voltage applied by the power supply unit 150. Generally, to secure conditions for a high deposition rate in a sputtering operation, a voltage control technique may be used. In this case, amount of electrons emitted from the surface of the cylindrical target 131 varies according to surface condition of the cylindrical target 131 in the sputtering device 100, and thus a voltage of the cylindrical target 131 may vary in correspondence thereto.

For example, if the cylindrical target 131 is formed of aluminum, when deposition is initiated and flow rate of oxygen is small, a metal layer may be formed on the substrate S. Next, if more oxygen is injected, an oxide layer is formed on the surface of the cylindrical target 131 and electrons are more smoothly discharged, and thus a voltage of the cylindrical target 131 drops. Next, if the voltage of the cylindrical target 131 further drops, the surface of the cylindrical target 131 is completely oxidized, and deposition rate may become very slow. Therefore, to form an aluminum oxide layer on the substrate S, a sputtering operation is performed in a domain in which a voltage of the cylindrical target 131 dops and flow rate of oxygen drops, where the deposition rate may be controlled by fixing the voltage of the cylindrical target 131 and controlling the flow rate of oxygen (operation S110).

During the deposition, the control unit 180 may store flow rates of oxygen measured by the sensor unit 160 (operation S120).

After the deposition is performed, the thickness measuring unit 170 may measure thickness of a material deposited on the substrate S (operation S130). The thickness measuring unit 170 may transmit the measured thickness of the material deposited on the substrate S to the control unit 180, and the control unit 180 may calculate a deposition rate of the material based on the thickness of the deposited material and moving speed of the substrate S (operation S140).

Here, the deposition rate of the deposited material may be calculated by multiplying the moving speed of the substrate S by the thickness of the material deposited on the substrate S, as described above. After calculating the deposition rate, the control unit 180 may correlate deposition rates to flow rates of oxygen and store them.

The task as described above may be performed a number of times while a deposition is performed onto one substrate S. Here, the thickness measuring unit 170 may measure thickness of the material deposited on the substrate S a number of times, and the sensor unit 160 may measure flow rates of oxygen corresponding to the measured thicknesses and transmit the flow rates of oxygen to the control unit 180. The control unit 180 may calculate the deposition rate of the material based on the values, calculate a relationship between flow rates of oxygen and deposition rates, and store the relationship. Here, the control unit 180 may store flow rates of oxygen and deposition rates in the form of a table (operation S150).

Additionally, the task as described above may be performed every time deposition is performed with respect to a plurality of substrates S. For example, the control unit 180 may measure flow rates of oxygen and thicknesses of a material deposited on the substrate S while a deposition is being performed to one substrate S and calculate a deposition rate of the material. Furthermore, while a deposition is being performed to a subsequent substrate S, the control unit 180 may repeat the tasks as described above and re-calculates a deposition rate of the material. Here, the tasks as described above may be repeatedly performed with respect to each of the substrates S.

The tasks as described above may be performed for a number of times that are preset to the control unit 180. Here, after the tasks as described above are performed for a preset number of times, data or an equation regarding deposition rates of the material according to fluxes of oxygen may be stored in the control unit 180. Particularly, it may be set to the control unit 180 to perform the tasks as described above for at least twice.

A result thereof is shown in FIG. 6. In FIG. 6, it is clear that the deposition rate decreases as a number of substrates increases. Here, restorations of the deposition rate are due to pre-sputtering operations.

Furthermore, FIG. 6 shows a graph showing flow rates of oxygen measured according to a number of substrates. Here, it is clear that flow rate of oxygen also decreases according to a number of substrates. FIG. 7 shows a graph of deposition rate against flow rate of oxygen calculated based on the above-stated data.

Here, the relationship between flow rates of oxygen and deposition rates may be a linear relationship. In detail, the deposition rate of a material may be proportional to the flow rate of oxygen. The relationship as described above may be stored in the form of an equation or a table in the control unit 180.

Particularly, as shown in FIG. 7, regardless the number of times for performing depositions on the substrate S in the sputtering device 100, the deposition rate versus the flow rate of oxygen is almost constant.

After the tasks as described above are completed, when the substrate S is introduced into the chamber 110, a second target thickness for deposition on the substrate S may be stored in the control unit 180. Here, the control unit 180 may determine whether an equation or a table regarding the deposition rate according to the flow rate of oxygen is stored in the control unit 180 (operation S160).

If it is determined that an equation or a table regarding the deposition rate according to the flow rate of oxygen is not stored in the control unit 180, the control unit 180 may repeat the operations as described above and calculate the deposition rate according to the flow rate of oxygen.

Alternatively, if it is determined that an equation or a table regarding the deposition rate according to the flow rate of oxygen is stored in the control unit 180, the control unit 180 may receive the flow rate of oxygen measured by the sensor unit 160 and calculate the deposition rate of a material to be deposited. Here, the control unit 180 may calculate the deposition rate by selecting a deposition corresponding to the corresponding flow rate of oxygen from a table or by applying the flow rate of oxygen to a calculated equation (operations S170 and S180).

The control unit 180 may calculate the moving speed of the substrate S based on the calculated deposition rate. Here, the moving speed of the substrate S may be calculated by dividing the deposition rate by the second target thickness. After the moving speed of the substrate S is calculated as described above, the control unit 180 may control the driving unit 140 to move the substrate S at the calculated moving speed (operation S190).

Furthermore, the control unit 180 may control the power supply unit 150 and the driving unit 140 to deposit a material on the substrate S while the substrate S is being moved. Here, if the target unit 130 linearly moves, the moving speed of the target unit 130 may be set to be identical to the calculated moving speed of the substrate S (operation S200).

The tasks as described above may be performed even while a material is being deposited on the substrate S via the sputtering device 100. Here, the sensor unit 160 may receive feedback of the measured flow rate of oxygen or flow rate of nitrogen and repeatedly perform the tasks as described above.

Therefore, the sputtering device 100 may calculate the deposition rate of a material from the flow rate of oxygen or flow rate of nitrogen inside the chamber 110, thereby calculating and applying the best moving speed of the substrate S or the best moving speed of the target unit 130 for the second target thickness.

Furthermore, because the sputtering device 100 may calculate the moving speed of the substrate S or the moving speed of the target unit 130 as described above, the sputtering device 100 may deposit to a precise thickness without continuously monitoring thickness of a material deposited on the substrate S.

The sputtering device 100 may easily correct thickness of a material deposited on the substrate S in real time based on the flow rate of oxygen or flow rate of nitrogen inside the chamber 110.

Furthermore, the sputtering device 100 may easily control thickness of a material to be deposited, and thus thickness of a desired material may be conveniently managed.

Figure 8:
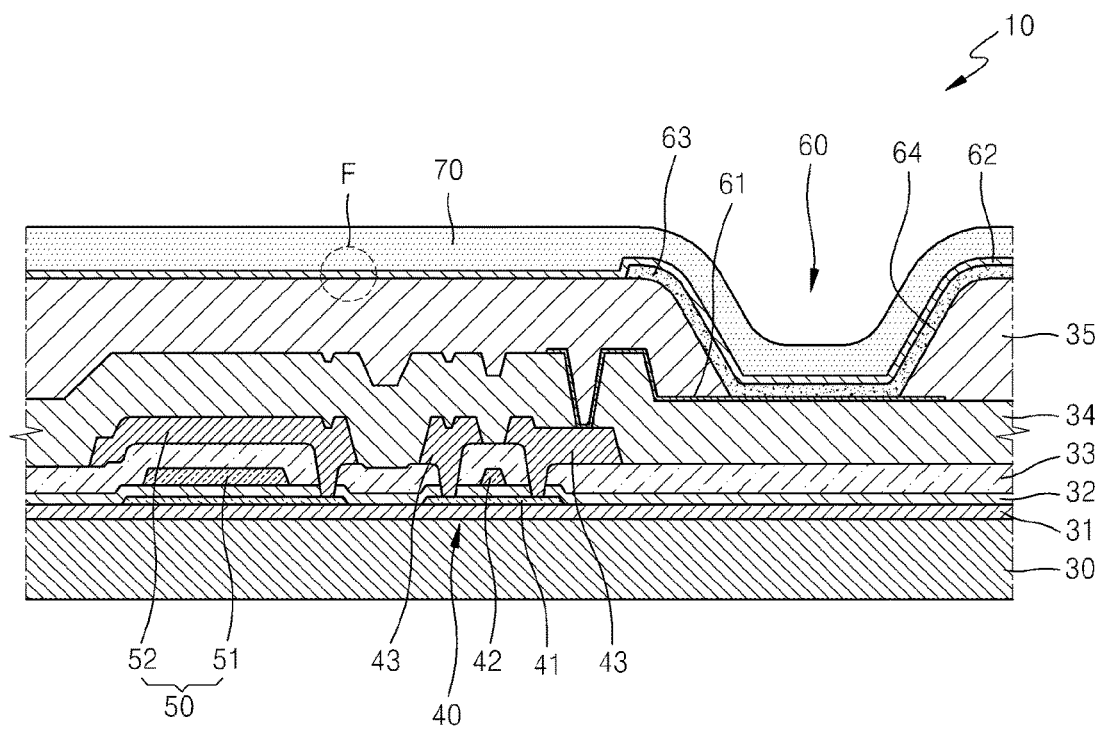
FIG. 8 is a sectional view showing an organic light emitting display apparatus manufactured by using the sputtering device shown in FIG. 1.
Figure 9:
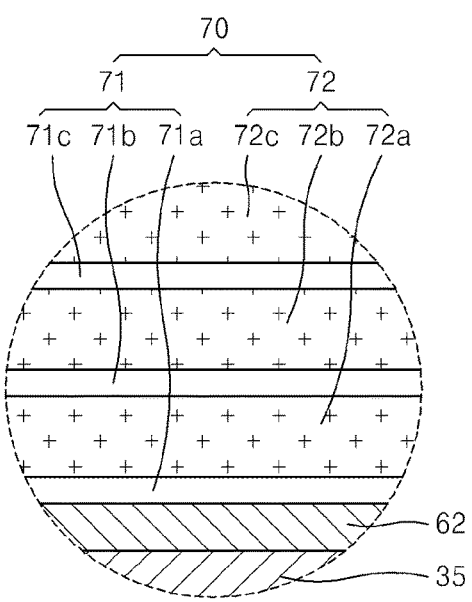
FIG. 9 is a sectional view showing the portion F of FIG. 8 in closer detail.

FIG. 8 is a sectional view showing an organic light emitting display apparatus 10 manufactured by using the sputtering device 100 shown in FIG. 1. FIG. 9 is a sectional view showing the portion F of FIG. 8 in closer detail.

Referring to FIGS. 8 and 9, an organic light emitting display apparatus 10 is formed on a substrate 30. The substrate 30 may be formed of a glass material, a plastic material, or a metal.

A buffer layer 31, which provides a flat surface on the substrate 30 and contains an insulating material for preventing permeation of moisture and impurities toward the substrate 30, is formed on the substrate 30.

A thin-film transistor (TFT) 40, a capacitor 50, and an organic light emitting device 60 are formed on the buffer layer. The TFT 40 includes an active layer 41, a gate electrode 42, and source electrode and drain electrode 43. The organic light emitting device 60 includes a first electrode 61, a second electrode 62, and an intermediate layer 63. The capacitor 50 includes a first capacitor electrode 51 and a second capacitor electrode 52.

In detail, the active layer 41 formed to have a designated pattern is arranged on top surface of the buffer layer 31. The active layer 41 may contain an inorganic semiconductor material, such as silicon, an organic semiconductor material, or an oxide semiconductor material and may selectively be doped with a p-type dopant or an n-type dopant.

A gate insulation layer 32 is formed on the active layer 41. The gate electrode 42 is formed on the gate insulation layer 32 in a position overlapping the active layer 41. The first capacitor electrode 51 may be formed on the gate insulation layer 32, where the first capacitor electrode 51 may be formed of a same material as the gate electrode 42.

An interlayer insulation layer 33 is formed to cover the gate electrode 42, and the source electrode and drain electrode 43 are formed on the interlayer insulation layer 33, where the source electrode and drain electrode 43 are formed to contact a designated portion of the active layer 41. The second capacitor electrode 52 may be formed on the interlayer insulation layer 33, where the second capacitor electrode 52 may be formed of a same material as the source electrode and drain electrode 43.

A passivation layer 34 is formed so as to cover the source electrode and drain electrode 43, and an additional insulation layer may be further formed on the passivation layer 34 for planarization of the TFT 40.

The first electrode 61 is formed on the passivation layer 34. The first electrode 61 is formed to be electrically connected to one from between the source electrode and drain electrode 43. Next, a pixel defining layer 35 is formed to cover the first electrode 61. After a designated opening 64 is formed in the pixel defining layer 35, the intermediate layer 63 including an emission layer is formed in a region defined by the opening 64. The second electrode 62 is formed on the intermediate layer 63.

An encapsulation layer 70 is formed on the second electrode 62. The encapsulation layer 70 may contain an organic material or an inorganic material and may have a structure in which organic materials and inorganic materials are alternately stacked.

In detail, the encapsulation layer 70 may be formed by using the sputtering device 100. In other words, after the substrate 30 on which the second electrode 62 is formed is introduced into the chamber 110, a desired layer may be formed by using the sputtering device 100.

Particularly, the encapsulation layer 70 includes an inorganic layer 71 and an organic layer 72, where the inorganic layer 71 includes a plurality of layers 71a, 71b, and 71c, and the organic layer 72 includes a plurality of layers 72a, 72b, and 72c. Here, the plurality of layers 71a, 71b, and 71c of the inorganic layer 71 may be formed by using the sputtering device 100.

However, the present disclosure is not limited thereto. In other words, the gate electrode 42, the source electrode and drain electrode 43, the first electrode 61, and the second electrode 62 of the organic light emitting display apparatus 10 may be formed by using the sputtering device 100.

Furthermore, the buffer layer, the gate insulation layer 32, the interlayer insulation layer 33, the passivation layer 34, the pixel defining layer 35, and other insulation layers may also be formed by using the sputtering device 100.

As described above, by using the sputtering device 100 according to the present embodiments, characteristics of a deposition layer formed at the organic light emitting display apparatus 10 may be improved, thereby improving electric characteristics and image quality of the organic light emitting display apparatus 10 may be improved.

As described above, according to the one or more of the above embodiments of the present disclosure, a sputtering device and a sputtering method may easily control deposition thickness.

It should be understood that the example embodiments described therein should be considered in a descriptive sense only and not for purposes of limitation. Descriptions of features or aspects within each embodiment should usefully be considered as available for other similar features or aspects in other embodiments.

While one or more embodiments have been described with reference to the figures, it will be understood by those of ordinary skill in the art that various changes in form and details may be made therein without departing from the spirit and scope of the present disclosure, including the following claims.

What is claimed is:

1. A sputtering device comprising:
   a chamber;
   a supporting unit, which is arranged inside the chamber and supports a substrate;
   a target unit, which is arranged inside the chamber to face the supporting unit;
   a driving unit, which is connected to either the supporting unit or the target unit and linearly moves either the supporting unit or the target unit to which it is connected;
   a power supply unit, which applies a voltage between the target unit and the supporting unit, between the target unit and the chamber, or between the target unit and the substrate;
   a sensor unit, which measures at least one of a flow rate of oxygen and a flow rate of nitrogen inside the chamber;
   a thickness measuring unit, which measures a thickness of a material deposited on the substrate; and
   a control unit, which controls the driving unit to be driven according to preset values to deposit the material on the substrate to a preset first target thickness, controls the power supply unit to form a preset voltage to deposit the material on the substrate, calculates a deposition rate of the deposited material from either a moving speed of the substrate or a moving speed of the target unit and a deposition thickness of the deposited material measured by the thickness measuring unit, and calculates and stores a relationship between the at least one of the flow rate of oxygen and the flow rate of nitrogen measured by the sensor unit during a deposition of the deposited material and the deposition rate.

2. The sputtering device of claim 1, wherein the deposition rate of the deposited material is calculated by multiplying either the moving speed of the substrate or the moving speed of the target unit by the thickness of the deposited material.

3. The sputtering device of claim 2, wherein the control unit stores the deposition rate of the deposited material according to either the flow rate of oxygen or the flow rate of nitrogen.

4. The sputtering device of claim 3, wherein the relationship between either the flow rate of oxygen or the flow rate of nitrogen and the deposition rate of the deposited material is a linear relationship.

5. The sputtering device of claim 1, wherein the control unit calculates the deposition rate corresponding to either the flow rate of oxygen or the flow rate of nitrogen inside the chamber that is measured by the sensor unit after deposition is completed with respect to at least one substrate.

6. The sputtering device of claim 5, wherein the control unit calculates the moving speed of the substrate or the moving speed of the target unit according to a preset second target thickness from the calculated deposition rate.

7. The sputtering device of claim 6, wherein the control unit deposits the material on the substrate while controlling the driving unit to move the substrate or the target unit at the calculated moving speed.

8. A sputtering method comprising:
introducing a substrate into a chamber, the substrate supported by a supporting unit and facing a target unit;
supplying oxygen or nitrogen into the chamber;
applying a voltage to one from among between the supporting unit and the target unit, between the chamber and the target unit, and the substrate and the target unit; performing a deposition to a preset first target thickness;
measuring and storing either a flow rate of the oxygen or a flow rate of the nitrogen while the deposition is being performed;
storing either a moving speed of the supporting unit or a moving speed of the target unit;
calculating a deposition rate of the material based on either the moving speed of the supporting unit or the moving speed of the target unit and a thickness of the material deposited on the substrate.

9. The sputtering method of claim 8, wherein the deposition rate of the deposited material is calculated by multiplying either the moving speed of the substrate or the moving speed of the target unit by the thickness of the deposited material.

10. The sputtering method of claim 9, further comprising calculating and storing a relationship between either the flow rate of oxygen or the flow rate of nitrogen and the deposition rate of the deposited material.

11. The sputtering method of claim 10, wherein the relationship between either the flow rate of oxygen or the flow rate of nitrogen and the deposition rate of the deposited material is a linear relationship.

12. The sputtering method of claim 10, wherein either the flow rate of oxygen or the flow rate of nitrogen and the deposition of the material corresponding thereto are stored in the form of a table.

13. The sputtering method of claim 10, further comprising, when the above-stated operations are completed and a substrate is introduced into the chamber, measuring flow rate of oxygen or flow rate of nitrogen inside the chamber.

14. The sputtering method of claim 13, further comprising determining the deposition rate corresponding to the measured flow rate of oxygen or flow rate of nitrogen.

15. The sputtering method of claim 14, further comprising calculating either the moving speed of the substrate or the moving speed of the target unit based on a preset second target thickness and the deposition rate; and
depositing the material on the substrate while moving the substrate or the target unit.

16. The sputtering method of claim 8, further comprising repeating the introducing, supplying, applying, measuring and storing, storing, and calculating processes for a plurality of substrates.

17. The sputtering method of claim 8, further comprising determining whether there is data related to the deposition rate corresponding to the flow rate of oxygen or the flow rate of nitrogen.

18. The sputtering method of claim 17, further comprising, if there is no data related to the deposition rate corresponding to the flow rate of oxygen or the flow rate of nitrogen, securing data related to the deposition rate corresponding to the flow rate of oxygen or the flow rate of nitrogen by repeating the introducing, supplying, applying, measuring and storing, storing, and calculating processes.

* * * * *